United States Patent
Nielsen et al.

(10) Patent No.: US 12,222,411 B2
(45) Date of Patent: Feb. 11, 2025

(54) MAGNETIC RESONANCE IMAGING SYSTEM AND METHOD USING FREQUENCY CALIBRATION BASED ON A SIGNAL FROM A GEO-SATELLITE POSITIONING SYSTEM

(71) Applicant: KONINKLIJKE PHILIPS N.V., Eindhoven (NL)

(72) Inventors: Tim Nielsen, Hamburg (DE); Christoph Günther Leussler, Hamburg (DE); Peter Vernickel, Hamburg (DE); Oliver Lips, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 94 days.

(21) Appl. No.: 18/014,563

(22) PCT Filed: Jun. 22, 2021

(86) PCT No.: PCT/EP2021/066896
§ 371 (c)(1),
(2) Date: Jan. 5, 2023

(87) PCT Pub. No.: WO2022/008223
PCT Pub. Date: Jan. 13, 2022

(65) Prior Publication Data
US 2023/0258750 A1    Aug. 17, 2023

(30) Foreign Application Priority Data
Jul. 7, 2020    (EP) .................................... 20184482

(51) Int. Cl.
*G01V 3/00*    (2006.01)
*G01R 33/36*    (2006.01)
*G01R 33/58*    (2006.01)

(52) U.S. Cl.
CPC ..... *G01R 33/3692* (2013.01); *G01R 33/3607* (2013.01); *G01R 33/583* (2013.01)

(58) Field of Classification Search
CPC .............. G01R 33/3415; G01R 33/543; G01R 33/5659; G01R 33/36; A61B 5/055
USPC ........................................................ 324/314
See application file for complete search history.

(56) References Cited

U.S. PATENT DOCUMENTS 5,440,313 A    8/1995 Osterdock et al.
2010/0259261 A1    10/2010 Saes et al.

FOREIGN PATENT DOCUMENTS

CN    103955004 A    *    7/2014
RU    2518857 C2    *    6/2014    ............... G01V 1/00

OTHER PUBLICATIONS

Pulseblaster DDS: Programmable TTL and DDS RF Pulse Generator.

(Continued)

*Primary Examiner* — Walter L Lindsay, Jr.
*Assistant Examiner* — Frederick Wenderoth

(57) ABSTRACT

A method of setting an RF operating frequency of an MRI system (1) uses a first reference frequency signal, obtained from a geo-satellite positioning system, as a stable long term frequency reference. A second frequency source (24) is calibrated using the first frequency reference signal and the second frequency reference source (24) is then used as the master clock for the MRI system (1), for setting the RF operating frequency.

20 Claims, 2 Drawing Sheets

(56) References Cited

OTHER PUBLICATIONS

Fan et al."Gaseous 3HE Nuclear Magnetic Resonance Probe for Crygenic Enviornments" Rev. Sci. Instrum. 90, (2019).
Bahner et al."Multichannel Magnetic Resonance Probe for Cryogenic Enviornments" Mar. 3, 2015.
Marjanovic et al."A Reconfigurable Platform for Magnetic Resonance Data Acquisition and Processing" IEEE Transactions On Medical Imaging vol. 39, No. Apr. 4, 2020.
Gross et al "Dynamic Nuclear Magnetic Resonance Field Sensing With Part-Per Trillion Resolution" Nat Commun. 7, 13702 (2016).
International Search Report and Written Opinion from PCT/EP2021/066896 mailed Oct. 10, 2021.
OCXO Specification downloaded Dec. 29, 2022.

\* cited by examiner

MAGNETIC RESONANCE IMAGING SYSTEM AND METHOD USING FREQUENCY CALIBRATION BASED ON A SIGNAL FROM A GEO-SATELLITE POSITIONING SYSTEM

CROSS REFERENCE TO RELATED APPLICATIONS

This application is a U.S. national phase application of International Application No. PCT/EP2021/066896 filed on Jun. 22, 2021, which claims the benefit of EP application No. 20184482.6 filed on Jul. 7, 2020 and is incorporated herein by reference.

FIELD OF THE INVENTION

The invention relates to magnetic resonance imagining, MRI, systems, and in particular the measurement of, and setting of, the RF resonance frequency.

BACKGROUND OF THE INVENTION

Magnetic resonance imaging (MRI) is a medical imaging technique used in radiology to form pictures of the anatomy and the physiological processes of the body. MRI scanners use strong magnetic fields, magnetic field gradients, and radio waves to generate images of the organs in the body.

MRI is widely used in hospitals and clinics for medical diagnosis and staging and follow-up of disease without exposing the body to radiation.

MRI is based on the ability of certain atomic nuclei to absorb radio frequency energy when placed in an external magnetic field. The resultant evolving spin polarization can induce an RF signal in a radio frequency coil and thereby be detected.

Hydrogen atoms are most often used to generate a macroscopic polarization that is detected by antennas close to the subject being examined. Hydrogen atoms are naturally abundant in humans and other biological organisms, particularly in water and fat. For this reason, most MRI scans essentially map the location of water and fat in the body.

Pulses of radio waves excite the nuclear spin energy transition, and magnetic field gradients localize the polarization in space. By varying the parameters of the pulse sequence, different contrasts may be generated between tissues based on the relaxation properties of the hydrogen atoms therein.

Precise knowledge of the water resonance frequency is necessary to perform high quality MR imaging, in particular to control the frequency of the radio wave pulses, so that they are at the correct Larmor frequency. However, the frequency setting which needs to be applied to the RF coils is influenced by many factors such as temperature drifts, ageing of electronics, current loss in the magnet, and patient-induced field changes.

The interplay between these factors is not well understood at the moment. Several candidate mechanisms have been suggested and investigated as sources for this frequency contrast. A primary candidate is an altered bulk magnetic susceptibility of the tissue being imaged.

The resonance frequency ($F0$) to be used (for RF field synthesis and detection) during an MRI procedure is determined in a dedicated preparation phase (the so-called "$F0$ preparation phase") by analyzing the free induction decay (FID) of a sub-volume of the patient inside the imaging bore.

During an MR exam, the $F0$ preparation phase is often repeated even if the patient position stays the same. This makes $F0$ determination the most time-consuming of all preparation phases.

Modelling $F0$ changes, in order to reduce the frequency with which the $F0$ measurements must be taken, is difficult because the current way of measuring $F0$ does not allow to distinguish potential sources of $F0$ changes, such as the electronics, magnet, patient, and temperature.

There is therefore a need for an improved accurate determination/prediction of the $F0$ frequency and/or for determining causes of changes in its value.

The article "Pulseblaster DDS: Programmable TTL and DDS RF pulse generator" (XP002361616) discloses a system for setting an RF operating frequency using a reference clock oscillator. The system can use a GPS-locked reference clock oscillator.

The article of Fan X. et. Al. "Gaseous 3He nuclear magnetic resonance probe for cryogenic environments" (XP012240173) discloses a 3He NMR probe.

The article of Klaus Bahner et. al. "Multichannel magnetic resonance sounding with wirelessly operated coils—A design study" (XP055761296) discloses a wireless magnetic resonance receive coil.

The article of Marjanovic Josip et. al. "A reconfigurable platform for magnetic resonance data acquisition and processing" (XP 011781004) discloses a platform which enables concurrent imaging and field sensing.

SUMMARY OF THE INVENTION

The invention is defined by the claims.

According to examples in accordance with an aspect of the invention, there is provided a method of setting an RF operating frequency of an MRI system, comprising:

using a first reference frequency signal, obtained from a geo-satellite positioning system, as a stable (long term) frequency reference;

obtaining calibration information for a second frequency source using the first frequency reference signal; and setting the RF operating frequency, using the second frequency source as the master clock for the MRI system, and using the calibration information.

This method enables calibration of the master clock (e.g. a 10 MHz clock) which is used to set the RF operating frequency corresponding to the Larmor frequency, $F0$ (e.g. 63.87 MHz for a 1.5 T field or 127.74 MHz for a 3 T field). Obtained calibration information basically involves determining the true frequency. In other words, a 10 MHz signal source (the second frequency source) has an intended 10 MHz clock signal output. However due to electronic drifts, for example, the true clock signal output may differ from this. By determining the true frequency, by comparison with the stable first frequency source, the generation of the RF operating frequency using the master clock signal can be adapted such that it has a known, desired, frequency, regardless of the actual frequency of the clock signal. There are various causes of possible frequency changes of the Larmor frequency, mainly due to (i) the electronics which generates the 10 MHz clock frequency used by the internal RF system of the MRI scanner and hence used to measure $F0$, (ii) changes (reduction) in the field $B0$ over time (iii) patient characteristics. The calibration of the master clock based on an externally stable geo-satellite clock signal removes fluctuations based on electronics drift. This assists in maintaining a correct application of an accurate $F0$ frequency. In turn, this may enable fewer or no $F0$ measurements at intermediate time points during a scan. It also may assist in determining more accurately the actual causes of shifts in the F0 frequency, by eliminating one of the possible causes. This may then lead to improved work flows for application during a scan.

The first reference frequency signal is for example obtained from a GPS system. This is a readily available source of a long term stable clock signal with off-the-shelf receiving circuitry. However, other geo-satellite systems may be used such as Galileo, DORIS, Glonass, Baidou).

The second frequency source for example comprises an oven controlled crystal oscillator. This provides a stable short term (e.g. at least for the full duration of a scan) clock signal source. Thus, the calibration enables the actual frequency of the second frequency source to be known, and it can remain constant for the required duration. Longer term drifts in the second frequency source can thus be compensated by the external more long term stable source.

The method further comprises measuring a frequency of operation of the MRI system, comprising:

placing a magnetic resonance signal probe into the imaging bore of the MRI system; and measuring a free induction decay using the magnetic resonance signal probe.

This provides a measurement of the Larmor frequency using a source which is not controlled by the electronics of the MRI imaging system. Thus, it can be used to detect independently a drift in the main field (the B0 field) within the MR bore.

The magnetic resonance signal probe also comprises a frequency reference which is calibrated by a signal obtained from a geo-satellite positioning system. This provides accurate measurement of the Larmor frequency.

The method may comprise measuring a free induction decay with a subject in the imaging bore of the MRI system and also without a subject in an imaging bore of the MRI system. In this way, the effect of the subject on the field may also be determined. In this way, the three possible sources of drift in F0 are separated, and the way the frequency is influenced by the different factors can be better understood, and then better factored into an imaging workflow.

The method may comprise placing an array of magnetic resonance signal probes into the imaging bore of the MRI system and measuring a free induction decay using each magnetic resonance signal probe. In this way, a distribution in 3D space may be obtained. This may be compared with the characteristics of the subject (e.g. their size and density distribution) to model the impact of the presence of the subject on the field strength and hence frequency.

The method may comprise monitoring the temporal characteristics of the field detected by the probe thereby to detect subject-induced variations.

The method may further comprise performing a resonant frequency calibration using the MRI system, and determining the master clock frequency based on the resonant frequency calibration and the measurement of the free induction decay using the magnetic resonance signal probe. In this way, the master clock frequency can be determined based on the both the internal system measurements and the external probe measurements. The required resonance frequency (e.g. as a multiple of the actual frequency generated by the second frequency source) can then be predicted and set very accurately.

The probe may be used to measure a frequency of operation of an MRI system, by:

using a first reference frequency signal, obtained from a geo-satellite positioning system, as a stable (long term) frequency reference;

obtaining calibration information for a second frequency source using the first frequency reference signal, the second frequency source forming part of a magnetic resonance signal probe;

placing the magnetic resonance signal probe into the imaging bore of the MRI system; and measuring a free induction decay using the magnetic resonance signal probe.

Thus, the frequency calibration described above may be used to provide a signal probe for accurately measuring an MRI operating frequency.

The invention also provides a system for setting an operating frequency of an MRI system, comprising:

an antenna for receiving a first reference frequency signal, from a geo-satellite positioning system, as a stable (long term) frequency reference;

a second frequency source for functioning as the master clock for the MRI system for setting the RF operating frequency; and a calibration system for obtaining calibration information for the second frequency source using the first frequency reference signal.

The antenna may comprise a GPS antenna.

The second frequency source may comprise an oven controlled crystal oscillator.

The system further comprises a magnetic resonance signal probe for insertion into the imaging bore of the MRI system for measuring a free induction decay. The probe for example comprises an MR-active substance and an RF coil to excite the magnetization and detect the magnetic resonance signal.

There may be an array of magnetic resonance signal probes for insertion into the imaging bore of the MRI system.

The magnetic resonance signal probe may be used for measuring a frequency of operation of an MRI system by measuring a free induction decay, and comprises:

an antenna for receiving a first reference frequency signal, from a geo-satellite positioning system, as a long term frequency reference;

a second frequency source for functioning as the master clock for the magnetic resonance signal probe;

a calibration system for obtaining calibration information for the second frequency source using the first frequency reference signal.

These and other aspects of the invention will be apparent from and elucidated with reference to the embodiment(s) described hereinafter.

BRIEF DESCRIPTION OF THE DRAWINGS

For a better understanding of the invention, and to show more clearly how it may be carried into effect, reference will now be made, by way of example only, to the accompanying drawings, in which.

DETAILED DESCRIPTION OF THE EMBODIMENTS

Figure 1:
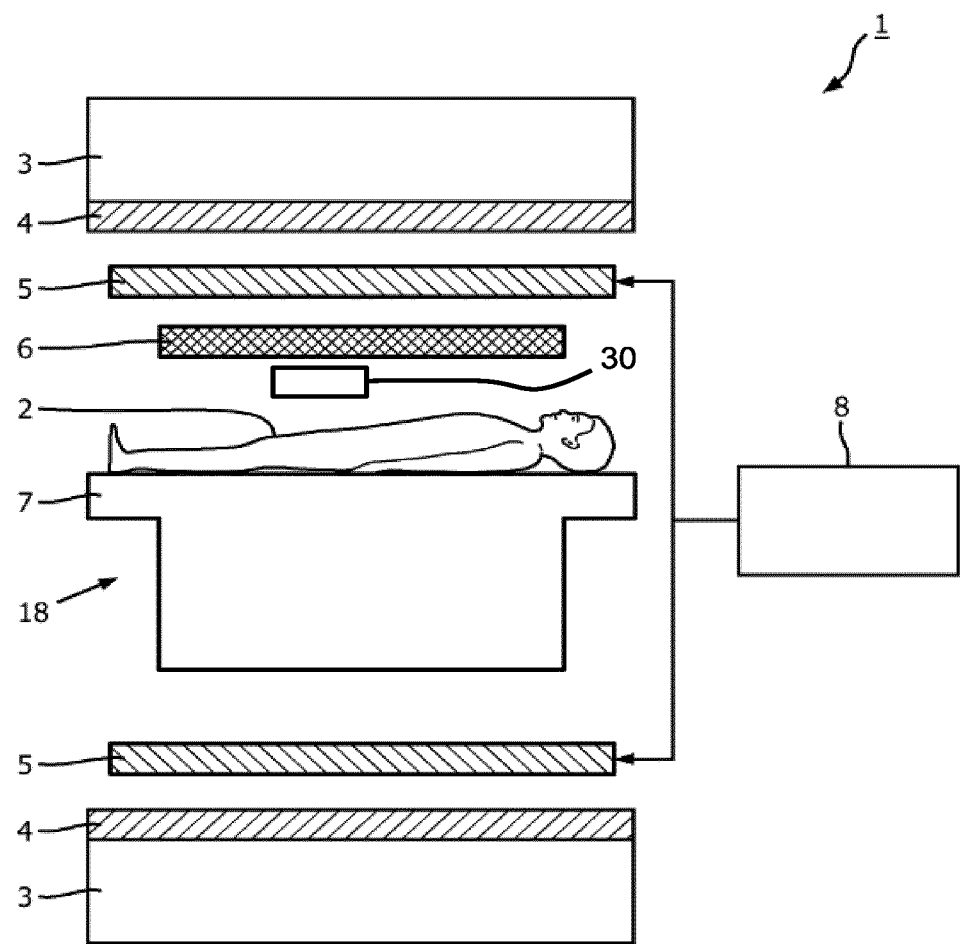
FIG. 1 shows a conventional MRI system and an additional MR sensor.

The invention will be described with reference to the Figures.

It should be understood that the detailed description and specific examples, while indicating exemplary embodiments of the apparatus, systems and methods, are intended for purposes of illustration only and are not intended to limit the scope of the invention. These and other features, aspects, and advantages of the apparatus, systems and methods of the present invention will become better understood from the following description, appended claims, and accompanying drawings. It should be understood that the Figures are merely schematic and are not drawn to scale. It should also be understood that the same reference numerals are used throughout the Figures to indicate the same or similar parts.

The invention provides a method of setting an RF operating frequency of an MRI system which uses a first reference frequency signal, obtained from a geo-satellite positioning system, as a long term frequency reference. A second frequency source is calibrated using the first frequency reference signal and the second frequency reference source is then used as the master clock for the MRI system, for setting the RF operating frequency.

FIG. 1 shows a conventional a MRI system 1 as well as an additional MR sensor 30. This MRI system 1 is used for MRI examination of a patient 2 in an examination area 18 within the bore of a superconducting magnet 3, which is used for generating a high static magnetic field. For positioning the patient 2 in the examination area 18, the patient 2 is positioned on a patient support 7, which may be driven into and out of the examination area 18 within the bore of the superconducting magnet 3.

The MRI system 1 is only shown with its most fundamental components, i.e. components which are of relevance for the present invention. In this respect, the MRI system 1 comprises a gradient coil 4 within the bore of the superconducting magnet 3 as well as RF transmit coils 5 and a RF receiver coil 6. The RF transmit coils 5 emit RF pulses, which are supplied from a RF transmitter 8, and generate a radio frequency magnetic field within the bore of the superconducting magnet 3.

As is well known by one of ordinary skill in the art, by transmitting RF pulses which have an orthogonal polarization to the magnetic field generated by the superconducting magnet 3 and matching the Larmor frequency of the nucleons of interest, the spins of the nucleons can be excited and brought into phase, and a deflection of their net magnetization from the direction of the field of the superconducting magnet 3 is obtained so that a transversal component in relation to the longitudinal component of the net magnetization is generated.

After termination of the RF pulse, the relaxation process of the longitudinal and reversal components of the net magnetization begin until the net magnetization has returned to its equilibrium state. Magnetic resonance signals, which are generated by the precessing magnetization are detected by means of the RF receiver coil 6.

The received magnetic resonance signals are time-based amplitude signals, which are further Fourier transformed to frequency-based magnetic resonance spectrum signals and further processed for generating a magnetic resonance image of the nucleons of interest.

The RF transmitter 8 comprises an RF amplifier for generating RF pulses and for forwarding these RF pulses to the RF transmit coil 5 of the MRI system 1. Further, the RF transmitter 8 typically comprises a capacitor bank which is coupled to the RF amplifier, for storing electric energy and for providing the RF amplifier with a current for generating the RF pulses. A mains power supply is coupled to the capacitor bank 10, for generating a charging current for charging the capacitor bank with electric energy.

Figure 2:
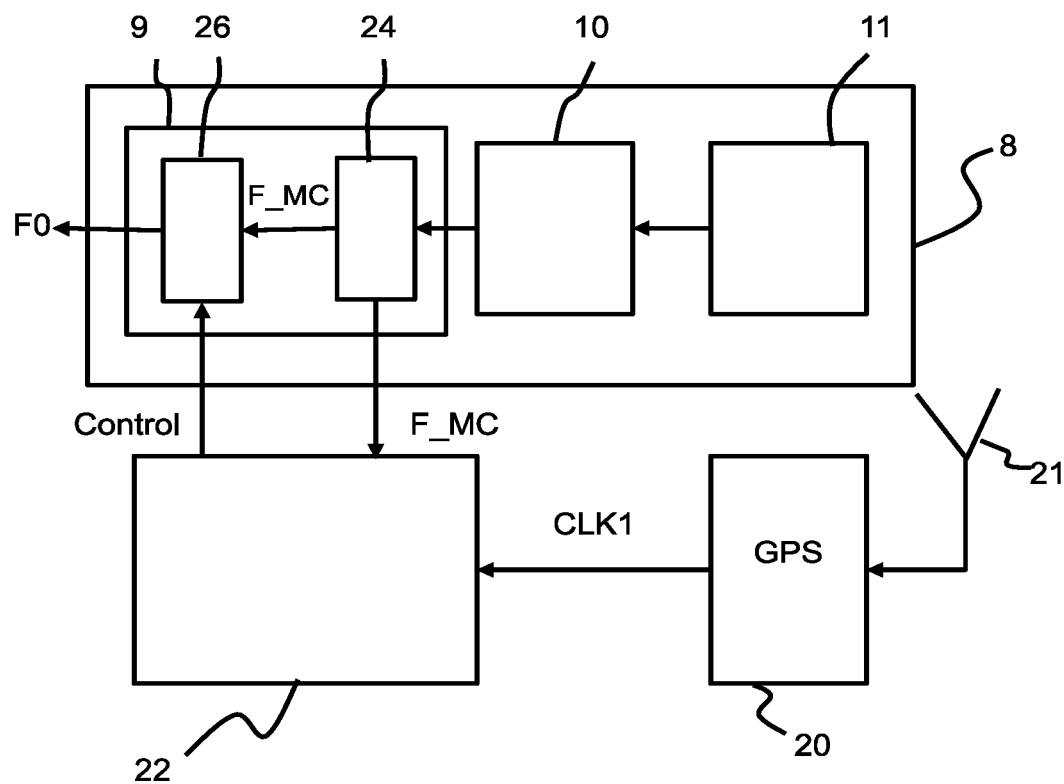
FIG. 2 shows an example of the RF transmitter.

FIG. 2 shows an example of the RF transmitter 8, comprising the RF amplifier 9 and the capacitor bank 10 coupled to the mains power supply 11.

The RF amplifier 9 for example comprises an oven controlled crystal oscillator (OCXO) 24. Suitable oven controlled oscillators as integrated devices are available such as the Farnell (Trade Mark) model LFOCXO067293BULK. This provides a single component giving a 10 MHz reference with approximately a relative stability of 10 to 12.

This level of stability is sufficient to rule out electronics drift as source for any observed F0 changes over a long time frame such as over weeks.

The invention makes use of a geo-satellite receiver 20 such as a GPS receiver and its associated antenna 21. The antenna 21 is for example incorporated into the quench pipe. The GPS signal is used to extract a first reference frequency signal CLK1, obtained from the geo-satellite positioning system, as a long term frequency reference.

The ranging codes and navigation messages which travel from the satellite to the receiver are modulated onto a carrier wave. In the case of the original GPS design, two frequencies are utilized; one at 1575.42 MHz (10.23 MHz×154) called L1; and a second at 1227.60 MHz (10.23 MHz×120), called L2. Either one of these carrier frequencies can be used as the long term frequency reference. Of course other geo-satellite systems may use different frequencies.

The RF amplifier comprises the oscillator 24 for generating the master clock signal F_MC and a conversion unit 26 for generating the required Larmor frequency from the master clock signal. The oscillator 24 functions as a second frequency source.

The master clock signal is for example a (desired/nominal) 10 MHz clock signal. This master clock signal F_MC is an external clock reference for a digital phase locked loop transmitter. It allows the main output reference frequency F0 to have almost any value between 42 MHz and 300 MHz (1T-7T), and any phase.

A controller 22 is provided for calibrating the second frequency source using the first frequency reference signal. This calibration involves determining the actual frequency of the master clock signal F_MC (thus taking into account any affects of electronic drift) by using the reference signal of known frequency CLK1 as a reference. This provides calibration information which is then used to determine how the output signal F_MC is processed to derive the RF frequency F0.

The second frequency reference source is used as the master clock for the MRI system, which master clock is used for setting the RF operating frequency F0, i.e. for RF synthesis and reception. Thus, the control signal "Control" for the conversion unit 26 is determined by the controller such that the correct operating frequency, i.e. the Larmor frequency, is generated from the master clock signal, based on the known the main field B0.

In this way, the conversion unit 26 receives the 10 MHz reference clock frequency for the MRI complex transmit pulse F0 (frequency, time and phase). The phase, time and frequency of the signal F0 is obtained using a signal generation circuit which applies digital and/or analog amplification. The controller 22 provides timing signals, digital time codes, and digital and/or analog signals as the input control for the conversion unit 26 to process F_MC. Calculation of the control signals is performed in the digital domain using software.

The frequency F0 is generated in the conversion unit 26 using a low jitter high quality reference clock (quartz often) locked to the GPS signal. The frequency F0 is generated by a high precision state of the art digital synthesizer.

Clock synchronization and calibration methods, as well as oscillator circuits for generating signals with a desired output frequency from a reference clock, will be well known to those skilled in the art.

This method enables calibration of the master clock (e.g. a 10 MHz clock) which is used to set the RF operating frequency corresponding to the Larmor frequency, F0 (e.g. 63.87 MHz for a 1.5 T field or 127.74 MHz for a 3T field).

The geo satellite system provides a highly stable oscillator which can be used as a frequency reference over a long time scale. This is combined with the short term stability of e.g. oven controlled crystal oscillators (OCXO). This improves the long term stability of measurement and also enables improved modelling and prediction of F0, since a highly probable source of frequency variation is eliminated, namely the electronics drift and ageing. It is currently not known how much the electronic frequency reference drifts over a longer timescale. This drift may not lead to image quality problems, since the MR frequency calibration is performed very often, even at intervals during the period of an individual scan. Nevertheless, it is suspected to be a substantial source of observed long term drifts of the measured resonance frequency.

The frequency calibration measure described above may be combined with the use of a dedicated MR signal probe 30 (shown in FIG. 1) placed inside the bore of the MRI system. This can be used to measure an FID signal from the probe independent from the MRI system. This enables measurement of the value of F0 without using exam time. It can also be used to differentiate between magnet drift and patient-induced changes.

The dedicated probe may also have its frequency source calibrated using the geo-satellite clock signal in exactly the same way as explained above. Thus, the dedicated probe may comprise a frequency reference which is calibrated by a signal obtained from a geo-satellite positioning system.

The dedicated signal probe thereby implements a method of measuring a frequency of operation of the MRI system, comprising:
  using a first reference frequency signal, obtained from a geo-satellite positioning system, as a long term frequency reference;
  obtaining calibration information for a second frequency source using the first frequency reference signal, the second frequency source forming part of the magnetic resonance signal probe; and
  measuring a free induction decay using the magnetic resonance signal probe.

The combination of both elements enables better understanding of the root causes for F0 changes, which could be used in predictive models or influence future system design. The MR signal probe 30 mainly consists of a small volume containing an MR-active substance and a RF coil to excite the magnetization and detect the MR signal. The control of the RF coil makes use of the frequency source which forms part of the probe. There are many known ways to build such a probe, for example as discussed in Simon Gross, et al., "Dynamic nuclear magnetic resonance field sensing with part-per-trillion resolution", Nat Commun 7, 13702 (2016) doi:10.1038/ncomms13702. Such designs can then be enhanced with the frequency calibration as explained above.

It is particularly advantageous to use a Fluorine compound as active substance because it has a frequency which is close to the water frequency but different enough to allow simultaneous operation with the MRI system without interference.

The probe could be placed behind the bore cover or under the patient table. Patient induced field variations could be distinguished from magnet drift by comparing measurements with and without the patient inside the bore which are taken within a short time period.

Placing multiple probes around the imaging volume could be used to generate a model of the spatial variations of the patient-induced field changes. Furthermore, dynamic variations of the field may be used to determine patient physiology signals (respiration and heart beat) A first approach, for taking account of dynamic variations, comprises:
  (i) measuring the field B0 by means of the calibrated probe at a reference position;
  (ii) calculating a deviation from the ideal resonance frequency; and
  (iii) applying the deviation when performing image generation and reconstruction.

A second approach, for taking account of spatial variations, comprises:
  (i) measuring the field B0 by means of the calibrated probe spatially resolved at a number of reference positions;
  (ii) calculating a deviation from the ideal resonance frequency;
  (iii) calculating higher order shim coefficients (for distortion correction of the field B0 with active coils); and
  (iv) applying the calculated shim coefficients during the scan for a more homogeneous B1 field of the radio frequency coil.

A third approach, for deriving patient physiology information, comprises:
  (i) measuring the field B0 by means of the calibrated probe at a reference position;
  (ii) calculating a deviation from the ideal resonance frequency, and temporally resolved with a resolution in the order of kHz;
  (iii) deriving temporal deviations and applying filtering for cardiac (kHz) or breathing effects (Hz);
  (iv) extracting physiology signals, for example for triggering purposes. The use of multiple sensors may be employed to increase sensitivity and spatial resolution.

Using a satellite based system ensures its applicability all over the world, thus all MRI scanners are synchronized to same reference clock.

As a further step, the results of the changes of the measured frequency of the independent probe 30, together with the frequency determined by the conventional calibration "inside" the same patient can be used to model the expected resonance frequency for the measurement. In this way the independent probe can predict in combination with the trained model the required resonance frequency for imaging probably very accurately.

The aim of the model is to determine the resonance frequency F0 without time-consuming measurements. The model is for example a trained neural network or decision tree algorithm which predicts the expected F0. The training data for the model consist of the resonance frequency, detailed B0 maps of patients, additional patient data typically available during exam (such as weight, sex, etc.). Other parameters of the scan and its setting are also known and may be used such as the table position and field of view.

Low resolution MR images which are less sensitive to F0 may be acquired for example for coil selection, and to give spatially and temporally resolved data of the field probe(s).

Additional training data may comprise RF measurement-based data such as coil loading and coil coupling, which is acquired typically much faster than the measurement of the resonance frequency, The model may be trained with known datasets.

The resonance frequency F0 has a spatial resolution since the underling B0 field varies with position. Typically, the resonance frequency is determined within a slice through the patient, and averaging over all slice volumes inside the patient is used to determined to derive the desired frequency. With spatial resolution, the resonance frequency may be measured at locations or areas which are most representative for the scan to be performed, e.g. the scan slice position.

Figure 3:
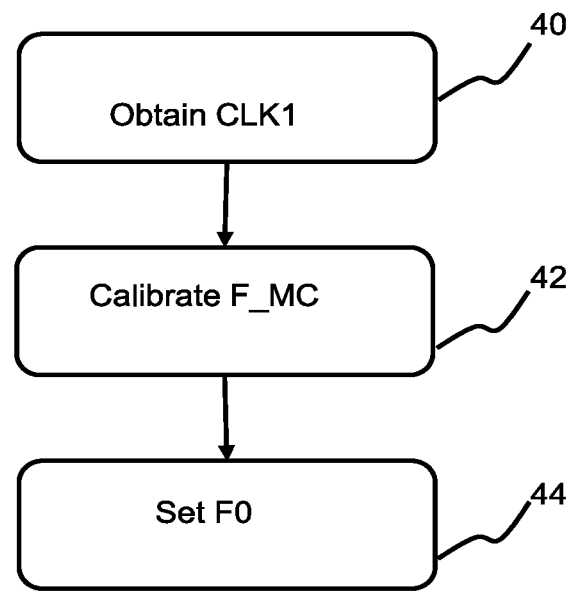
FIG. 3 shows a method of setting an RF operating frequency of an MRI system.

FIG. 3 shows a method of setting an RF operating frequency of an MRI system, comprising:

in step 40, using a first reference frequency signal, obtained from a geo-satellite positioning system, as a long term frequency reference;

in step 42, obtaining calibration information for a second frequency source using the first frequency reference signal; and in step 44, setting the RF operating frequency, using the second frequency reference source as the master clock for the MRI system, and using the calibration information.

Variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality.

The mere fact that certain measures are recited in mutually different dependent claims does not indicate that a combination of these measures cannot be used to advantage.

If the term "adapted to" is used in the claims or description, it is noted the term "adapted to" is intended to be equivalent to the term "configured to".

Any reference signs in the claims should not be construed as limiting the scope.

The invention claimed is:

1. A method of setting an RF operating frequency of an MRI system for RF synthesis and reception, comprising:
    using a first reference frequency signal, obtained from a geo-satellite positioning system, as a stable frequency reference;
    obtaining calibration information for a second frequency source for determining the true frequency, using the first reference frequency signal;
    setting the RF operating frequency, using the second frequency source as the master clock for the MRI system, and using the calibration information; and
    measuring the RF operating frequency by:
        placing a magnetic resonance signal probe into the imaging bore of the MRI system; and
        measuring a free induction decay using the magnetic resonance signal probe, wherein the magnetic resonance signal probe comprises a frequency reference which is calibrated by a signal obtained from a geo-satellite positioning system.

2. A system for setting an RF operating frequency of an MRI system for RF synthesis and reception, comprising:
    an antenna for receiving a first reference frequency signal (CLK1), from a geo-satellite positioning system, as a stable frequency reference;
    a second frequency source for functioning as the master clock for the MRI system for setting the RF operating frequency (F0);
    a calibration system for obtaining calibration information for the second frequency source using the first reference frequency signal; and
    a magnetic resonance signal probe for insertion into the imaging bore of the MRI system for measuring a free induction decay, wherein the magnetic resonance signal probe comprises a frequency reference which is calibrated by a signal obtained from a geo-satellite positioning system.

3. The method of claim 1, wherein the first reference frequency signal is obtained from a GPS system.

4. The method of claim 1, wherein the second frequency source comprises an oven controlled crystal oscillator.

5. The method of claim 1, comprising measuring the free induction decay with a subject in the imaging bore of the MRI system and without a subject in an imaging bore of the MRI system.

6. The method of claim 1, further comprising performing a resonant frequency calibration using the MRI system, and determining the master clock frequency based on the resonant frequency calibration and the measurement of the free induction decay using the magnetic resonance signal probe.

7. The system of claim 2, wherein the antenna comprises a GPS antenna.

8. The system of claim 2, wherein the second frequency source comprises an oven controlled crystal oscillator.

9. The system of claim 2, wherein the probe comprises an MR-active substance and an RF coil to excite the magnetization and detect the magnetic resonance signal.

10. The system of claim 2, comprising an array of magnetic resonance signal probes for insertion into the imaging bore of the MRI system.

11. The system of claim 2, wherein the magnetic resonance signal probe comprises a geo-satellite receiver.

12. The method of claim 1, wherein the magnetic resonance signal probe comprises a geo-satellite receiver.

13. The method of claim 1, wherein the geo-satellite receiver comprises a global positioning system (GPS) receiver.

14. The method of claim 5, comprising placing an array of magnetic resonance signal probes into the imaging bore of the MRI system and measuring a free induction decay using each magnetic resonance signal probe.

15. The method of claim 5, comprising monitoring the temporal characteristics of the field detected by the probe to detect subject-induced variations.

16. The method of claim 6, comprising modeling an expected resonance frequency using a trained model to determine the required resonance frequency for imaging.

17. The system of claim 10, wherein the free induction decay is measured with a subject in the imaging bore of the MRI system and without a subject in an imaging bore of the MRI system.

18. The system of claim 10, wherein the temporal characteristics of the field detected by the probe are monitored to detect subject-induced variations.

19. The system of claim 11, wherein the geo-satellite receiver comprises a global positioning system (GPS) receiver.

20. The method of claim 16, wherein the training data for the model comprises the resonance frequency, main field maps of patients, and additional patient data available during examination.

\* \* \* \* \*